(12) United States Patent
Suzuki et al.

(10) Patent No.: US 7,863,101 B2
(45) Date of Patent: Jan. 4, 2011

(54) STACKING SEMICONDUCTOR DEVICE AND PRODUCTION METHOD THEREOF

(75) Inventors: Takehiro Suzuki, Kanagawa (JP); Yasushi Takeuchi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 16 days.

(21) Appl. No.: 12/501,939

(22) Filed: Jul. 13, 2009

(65) Prior Publication Data

US 2009/0275172 A1 Nov. 5, 2009

Related U.S. Application Data

(62) Division of application No. 11/468,181, filed on Aug. 29, 2006, now abandoned.

(30) Foreign Application Priority Data

Aug. 31, 2005 (JP) ............................. 2005-250511
Aug. 21, 2006 (JP) ............................. 2006-224310

(51) Int. Cl.
*H01L 21/00* (2006.01)
(52) U.S. Cl. .................. 438/109; 438/121; 438/457; 257/E25.013; 257/685; 257/686
(58) Field of Classification Search .......... 257/E21.509, 257/E21.705, E25.011, E25.013, E25.023, 257/666, 685, 686, 737, 738, 777, 778; 438/109, 438/119, 121, 457, 660; 437/208
See application file for complete search history.

(56) References Cited

U.S. PATENT DOCUMENTS

| | | | |
|---|---|---|---|
| 5,854,507 A | 12/1998 | Miremadi et al. | 257/686 |
| 6,025,648 A | 2/2000 | Takahashi et al. | 257/778 |
| 6,054,759 A | 4/2000 | Nakamura | 257/691 |
| 6,188,127 B1 | 2/2001 | Senba et al. | 257/686 |
| 6,239,496 B1 | 5/2001 | Asada | 257/777 |
| 6,265,772 B1 | 7/2001 | Yoshida | 257/712 |
| 6,316,289 B1 | 11/2001 | Chung | 438/118 |
| 6,410,988 B1 | 6/2002 | Caletka et al. | 257/778 |
| 6,960,827 B2 | 11/2005 | Nishimura et al. | 257/723 |
| 7,071,028 B2 | 7/2006 | Koike et al. | 438/107 |

(Continued)

FOREIGN PATENT DOCUMENTS

JP 2004-281919 10/2004

(Continued)

*Primary Examiner*—Chris Chu
(74) *Attorney, Agent, or Firm*—Fitzpatrick, Cella, Harper & Scinto

(57) ABSTRACT

In a stacking semiconductor device in which a first-layer and a second-layer semiconductor devices are stacked and bonded with a solder, warpage occurs due to a difference in thermal expansion coefficient of constituent members or a difference in elastic modulus of individual members. Therefore, between the first-layer and the second-layer semiconductor devices are provided an external connection terminal of solder and a thermosetting resin, and the stacking semiconductor device is heated at 150 to 180° C., which are the temperatures of preheating for reflow of the solder, for 30 to 90 seconds. Thereby the warpage of the first-layer semiconductor device is reduced and the thermosetting resin is cured completely in this state. Then, the temperature is raised to a reflow temperature of the solder and solder bonding using the external connection terminal is performed. Thereby, the bonding reliability of a solder-bonded portion of the stacking semiconductor device is considerably improved.

2 Claims, 11 Drawing Sheets

U.S. PATENT DOCUMENTS

| | | | |
|---|---|---|---|
| 7,091,619 B2 * | 8/2006 | Aoyagi | 257/777 |
| 7,276,784 B2 | 10/2007 | Omizo et al. | 257/678 |
| 7,317,247 B2 | 1/2008 | Lee et al. | 257/706 |
| 7,635,912 B2 * | 12/2009 | Ejima | 257/678 |
| 7,759,799 B2 * | 7/2010 | Ejima | 257/773 |
| 2004/0222510 A1 * | 11/2004 | Aoyagi | 257/686 |
| 2004/0222519 A1 | 11/2004 | Aoyagi | 257/734 |
| 2004/0227236 A1 * | 11/2004 | Sawamoto | 257/734 |
| 2005/0001301 A1 | 1/2005 | Aoyagi | 257/686 |
| 2007/0045788 A1 * | 3/2007 | Suzuki et al. | 257/666 |
| 2007/0164445 A1 * | 7/2007 | Ejima | 257/777 |
| 2009/0039490 A1 * | 2/2009 | Fan | 257/686 |
| 2009/0102049 A1 * | 4/2009 | Murata et al. | 257/737 |

FOREIGN PATENT DOCUMENTS

| | | |
|---|---|---|
| JP | 2004-335603 | 11/2004 |

* cited by examiner

STACKING SEMICONDUCTOR DEVICE AND PRODUCTION METHOD THEREOF

RELATED APPLICATIONS

This application is a division of co-pending U.S. patent application Ser. No. 11/468,181, filed on Aug. 29, 2006 now abandoned, which is incorporated by reference herein in its entirety, as if fully set forth herein, and claims the benefit of priority under 35 U.S.C. §119, based on Japanese Priority Application Nos. JP 2005-250511, filed Aug. 31, 2005, and JP 2006-224310, filed Aug. 21, 2006, which are incorporated by reference herein in their entirety, as if fully set forth herein.

BACKGROUND OF THE INVENTION

1. Field of the Invention

The present invention relates to a stacking semiconductor device, in which semiconductor devices each having a semiconductor element provided thereon are stacked in at least two or more layers and three-dimensionally mounted, and a production method of the stacking semiconductor device.

2. Description of the Related Art

In recent years, the miniaturization of digital equipments, such as a digital still camera and a digital camcorder, has advanced and three-dimensional mounting which enables respective components to be mounted in a more space-saving manner is drawing attention. As the three-dimensional mounting, there have been known a stacked chip type in which semiconductor elements are stacked in two or more layers as a chip size package (CSP) and a ball grid array (BGA) and a stacking semiconductor device in which semiconductors are stacked in two or more layers.

FIG. 7 shows a stacked chip type semiconductor package, and a large semiconductor element 52 and a small semiconductor element 53 are provided on a wiring board 51 by sequential stacking. The wiring board 51 and the semiconductor elements 52, 53 are electrically connected to each other by wire bonds 54. The semiconductor elements 52, 53 and the wire bonds 54 are encapsulated with an encapsulant resin 55.

In recent years, stacking semiconductor devices disclosed in Japanese Patent Application Laid-Open Nos. 2004-281919 and 2004-335603, and the like are attracting lots of attention. A general stacking semiconductor device is shown in FIG. 8. On a wiring board 121 is mounted a semiconductor element 122 via an ACF resin 124. On a semiconductor device 102 constituted by the wiring board 121 and the semiconductor element 122, there is stacked a semiconductor device 103, in which a wiring board 131 having a semiconductor element 132 mounted thereon is encapsulated with an encapsulant resin 133. A land 123 on a front surface of the semiconductor device 102 and a land 133 on a rear surface of the semiconductor device 103 are bonded to each other by an external connection terminal (solder ball) 111. That is, the semiconductor device 102 and the semiconductor device 103 are electrically connected to each other by the solder ball 111. Further, on a rear surface of the wiring board 121 are provided a plurality of lands 125, and an external connection terminal (solder ball) 112 is attached to each of the lands 125.

FIGS. 9A, 9B and 9C are cross-sectional views which show the bonding steps of the semiconductor device 102 and semiconductor device 103 which constitute the stacking semiconductor device shown in FIG. 8. First, as shown in FIG. 9A, a flux 123a is supplied onto the land 123 on the front surface of the semiconductor device 102. Next, the semiconductor device 103 is mounted on the semiconductor device 102 via the solder balls 111. Incidentally, the solder balls 111 are bonded beforehand to the rear surface of the semiconductor device 103. With the semiconductor device 103 being mounted on the semiconductor device 102, the semiconductor device 102 and the semiconductor device 103 are subjected to a reflow process, whereby the solder ball 111 and the land 123 are bonded to each other. Next, as shown in FIG. 9B, solder balls 112 are bonded to the rear surface of the semiconductor device 102. The stacking semiconductor device thus completed is mounted on a mother board 104 as shown in FIG. 9C.

However, in a semiconductor device, warpage will occur readily due to a difference in coefficient of thermal expansion between a wiring board and a semiconductor element, which are constituent members of the semiconductor device, or a difference in modulus of elasticity between the respective constituent members. The mechanism of occurrence of warpage is described below by taking a general semiconductor device as an example. FIGS. 1A, 10B and 10C show a general semiconductor device in which a semiconductor element 122 is mounted on a wiring board 121 via an AFC resin 124. Usually, a semiconductor device warps in a convex manner with the semiconductor element 122 facing upward, as shown in FIG. 1A, due to differences in coefficient of linear expansion of the wiring board 121, the ACF resin 124 and the semiconductor element 122. The warpage occurs due to differences in coefficient of thermal expansion generated when the semiconductor device 102 goes through a heating step during the production process thereof. The amount of the warpage depends on the specifications of the respective constituent members. However, for example in a case where the thickness of the wiring board 121 is 0.4 to 0.5 mm, the thickness of the semiconductor element 122 is 0.1 to 0.2 mm and the size of the semiconductor device 102 is 10 to 15 mm, it has been confirmed that the wiring board 121 warps by about 40 to 50 μm.

The amount and direction of warpage of the wiring board 121 will vary depending on the heating temperature. That is, in a case where the wiring board 121 warps by 40 to 50 μm in the convex manner, as shown in FIG. 1A, at room temperature (23° C.), the wiring board 121 will warp by 20 to 30 μm in the reverse direction, i.e., in a concave manner as shown in FIG. 10C, at 220° C. which is a solder melting temperature.

FIGS. 11A, 11B and 11C show the state of formation of a stacking semiconductor device 1 by bonding a semiconductor device 103 onto such a semiconductor device 102.

First, as shown in FIG. 11A, the semiconductor device 103 is mounted on the semiconductor device 102 which warps by 40 to 50 μm in such a convex manner as to protrude toward the semiconductor element 122 side. Next, when heated up to 220° C. by a reflow process for melting solder balls 111, the wiring board 121 warps by 20 to 30 μm in a concave manner as shown in FIG. 11B. Furthermore, when the stacking semiconductor device 1 is cooled, the wiring board 121 will return to the convex shape shown in FIG. 11A. However, because the end portions restrained by the solder balls 111 are not deformed, the wiring board 121 will come to have a shape of letter W as shown in FIG. 11C. The stacking semiconductor device 1 having such a shape will pose the problem of co-planarity in the step of mounting on a mother board to generate bonding failures.

That is, as shown in FIG. 12, when the stacking semiconductor device 1 is mounted on the mother board 104, the solder balls 112 on the inner side of the wiring board 121 do not come into contact with the lands 141 of the mother board 104. For this reason, even when the solder melts, the balls 112 are not bonded to the mother board 104, thereby generating a connection failure.

Further, when heat is applied to the wiring board 121 of the stacking semiconductor device 1 by a reflow process or the like, the semiconductor device 102 is deformed from the letter W shape to a concave shape. At this time, if the amount of deformation of the wiring board 121 is large, the solder balls 112 just under the semiconductor element 122 are crushed and adjacent solders may come into contact with each other to cause short circuiting. Moreover, in the peripheral portions, the distance between the wiring board 121 and the mother board 104 increases and the solder is stretched, with the result that a connection failure may sometimes occur.

It has been ascertained that the amount of the warpage of the wiring board 121 becomes approximately double when the thickness of the wiring board becomes half. Therefore, with the size of a semiconductor device becoming smaller, the influence of the warpage of a wiring board increases. Particularly, in a stacking semiconductor device, miniaturization has advanced and the problem of warpage has become prominent.

Japanese Patent Application Laid-Open No. 2004-335603 discloses a stacking semiconductor device in which an adhesive 125 is interposed between a semiconductor device 102 and a semiconductor device 103, as shown in FIGS. 14A to 14C. The purpose of the interposition of the adhesive 125 is to accurately align the semiconductor device 102 and the semiconductor device 103 and to suppress peeling between the semiconductor devices. For this reason, the adhesive 125 needs to be cured after the solidification of the solder balls 111. Therefore, as the adhesive 125, a thermoplastic adhesive which does not cure during the reflow process of the solder and cures after the reflow is used.

However, in the stacking semiconductor device disclosed in Japanese Patent Application Laid-Open No. 2004-335603, it is not possible to suppress the warpage of a wiring board 121 which occurs during the reflow process for melting the solder. That is, when the semiconductor device 103 is mounted on the semiconductor device 102, the semiconductor device 102 warps in a convex manner, with the semiconductor element 122 facing upward. Further, when heated and subjected to the reflow process, the wiring board 121 warps in a concave manner as shown in FIG. 14A, because the adhesive 125 is not yet cured at this time. Next, the semiconductor device 102 is cooled and the adhesive 125 cures at a prescribed temperature. However, at this time, the wiring board 121 has already been deformed to have a shape of letter W as shown in FIG. 14B. Therefore, the problems of connection failure and short circuiting described above with reference to FIGS. 12 and 13 arise.

SUMMARY OF THE INVENTION

The present invention has been accomplished in view of the unresolved problems with the above-described prior art and provides a stacking semiconductor device which can suppress the amount of warpage of semiconductor devices to be stacked and avoid connection failure of an external connection terminal such as a solder ball, and a production method of the stacking semiconductor device.

To achieve the above object, the present invention provides a stacking semiconductor device which comprises a first-layer semiconductor device having a first semiconductor element mounted on a surface thereof; and a second-layer semiconductor device having a second semiconductor element mounted on a surface thereof, the second-layer semiconductor device being stacked via bonding means on the surface of the first-layer semiconductor device, wherein the bonding means comprises a solder joint in which the first-layer semiconductor device and the second-layer semiconductor device are bonded to each other with a solder, and an adhesion fixing portion in which the first-layer semiconductor device and the second-layer semiconductor device are adhered and fixed to each other with a thermosetting resin having a curing temperature less than a melting temperature of the solder.

Also, the present invention provides a method of producing a stacking semiconductor device having a first-layer semiconductor device and a second-layer semiconductor device disposed by stacking on each other, which comprises the steps of: providing, between a first-layer semiconductor device and a second-layer semiconductor device, a solder and a thermosetting resin for bonding the two semiconductor devices; heating the first-layer semiconductor device and the second-layer semiconductor device to a first temperature to cure the thermosetting resin; heating the first-layer semiconductor device and the second-layer semiconductor device to a second temperature which is more than the first temperature to melt the solder; and cooling the first-layer semiconductor device and the second-layer semiconductor device to solidify the solder.

The above and other objects of the invention will become more apparent from the following description taken in conjunction with the accompanying drawings.

Further features of the present invention will become apparent from the following description of exemplary embodiments with reference to the attached drawings.

DESCRIPTION OF THE EMBODIMENTS

First, a basic concept of the present invention is described. As described above with reference to FIGS. 10A, 10B and 10C, a general semiconductor device warps in a upwardly convex manner at room temperature (23° C.) as shown in FIG. 10A. When the semiconductor device is heated to 220° C. at which the solder melts, the semiconductor device warps in a concave manner (i.e., in a downwardly convex manner) as shown in FIG. 10C. Therefore, in the course of the heating from room temperature to 220° C., the semiconductor device inevitably goes through a non-warped state as shown in FIG. 10B. Usually, within the temperature range of 150° C. to 180° C., almost all semiconductor devices come into the non-warped state. In the present invention, attention is paid to this non-warped state, and at such temperatures the semiconductor device 103 is fixed and mounted to the semiconductor device 102.

Next, the best mode for carrying out the present invention will be described with reference to the attached drawings.

EXAMPLES

Figure 1:
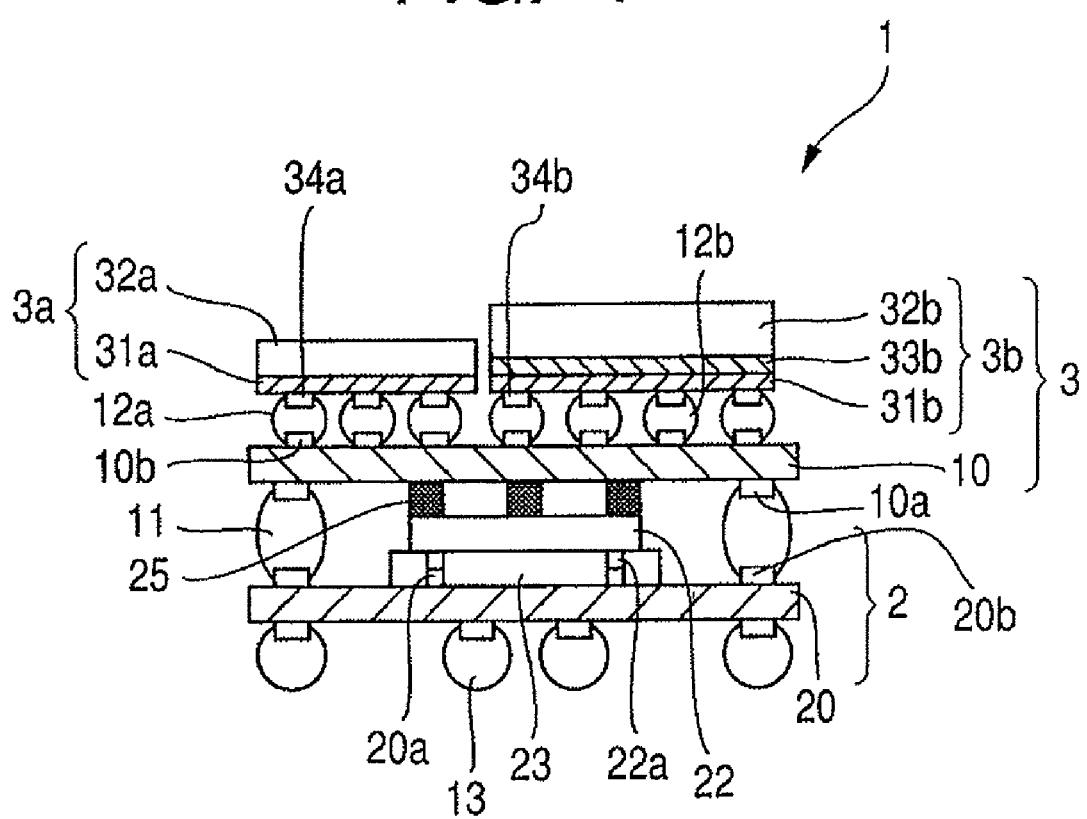
FIG. 1 is a cross-sectional view which shows a stacking semiconductor device in accordance with an example of the present invention.

As shown in FIG. 1, a stacking semiconductor device 1 of the present example is constituted by stacking a semiconductor device as a first layer (hereinafter, simply referred to as "first-layer semiconductor device") 2 and a semiconductor device as a second layer (hereinafter, simply referred to as "second-layer semiconductor device") 3. In the first-layer semiconductor device 2, lands 20a formed on a wiring board 20 and bumps 22a of a semiconductor element 22 are bonded to each other by means of an ACF (anisotropic conductive adhesive film) resin 23.

In the second-layer semiconductor device 3, a semiconductor package 3a and a semiconductor package 3b are mounted on a wiring board 10. On a rear surface of a semiconductor element 32a is formed a wiring layer 31a, and lands 34a provided on the wiring layer 31a are bonded to lands 10b provided on a front surface of the wiring board 10 via solder balls 12a. On a rear surface of a semiconductor element 32b are formed a buffer material 33b and a wiring layer 31b, and lands 34b provided on the wiring layer 31b are bonded to the lands 10b provided on the front surface of the wiring board 10 via solder balls 12b. On a rear surface of the wiring board 10 are formed lands 10a, and the lands 10a are bonded to lands 20b on the front surface of the wiring board 20 by solder balls 11.

The wiring board 10 and the wiring board 20 may be bonded to each other by pouring an encapsulant resin after thermocompression bonding and then curing the resin, or by applying ultrasonic waves or the like thereto. The solder balls 11, 12a, 12b, which function as external connection terminals, may be made of a metal as with PGA and LGA.

Between the semiconductor element 22 and the wiring board 10 is disposed a thermosetting resin 25 which cures completely at curing temperatures of 150° C. to 180° C. for 30 seconds to 90 seconds. That is, it follows that the first-layer semiconductor device 2 and the second-layer semiconductor device 3 are bonded to each other by the thermosetting resin 25 and the balls 11. As the thermosetting resin 25, there is used a thermosetting resin which has a curing temperature less than the reflow process temperature of 220° C. at which the solder melts. As a result, it is possible to perform the curing of the thermosetting resin 25 in a preheating step for the reflow process.

It is preferred that the thermosetting resin 25 firmly fix only the wiring board 10 and the semiconductor element 22 mounted on the first-layer semiconductor device 2 to each other. That is, if the thermosetting resin 25 is disposed on the whole area of the first-layer semiconductor device 2 and the second-layer semiconductor device 3 is adhered thereto, there is a possibility that the stresses of the wiring boards 10, 20 cannot be relieved because the thermosetting resin 25 is highly resistant to thermal stresses. Moreover, there is also a possibility that the thermosetting resin 25 may intrude between the solder ball 11 and the lands 10a, 20b to cause a bonding failure.

As will be described later, the thermosetting resin 25 is used to fix the wiring board 10 and the semiconductor element 22, with the amount of warpage of the first-layer semiconductor device 2 being reduced. Therefore, it is necessary to use a thermosetting resin having a relatively high rigidity. If a low-rigidity thermosetting resin is used, the thermosetting resin will follow the warpage of the first-layer semiconductor device 2, so that it becomes difficult to suppress the warpage.

Figure 2:
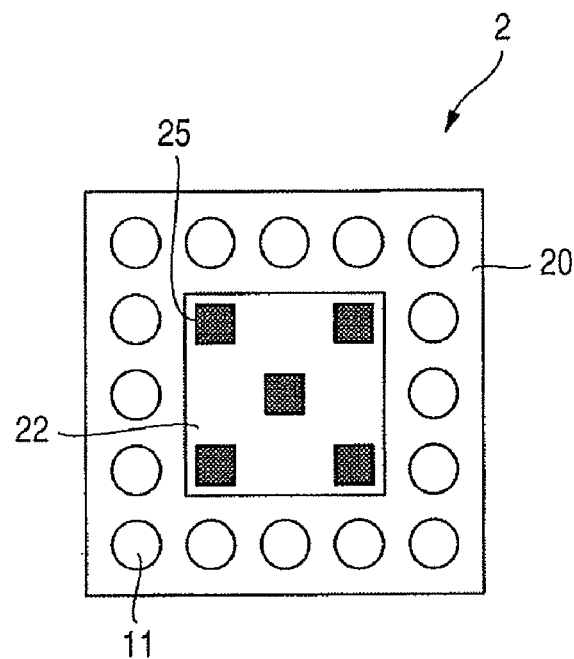
FIG. 2 is a plan view which shows an applied shape of a thermosetting resin in accordance with an example of the present invention.

Because, in general, stresses generated by warpage are large in the end portions or the center part of the semiconductor element 22, it is preferred that the thermosetting resin 25 is not applied to the whole area of the surface of the semiconductor element 22 but is rather disposed in a dispersed manner on the surface of the semiconductor element 22. FIG. 2 is a schematic view when the first-layer semiconductor device 2 is viewed from above in FIG. 1. In FIG. 2, the thermosetting resin 25 is disposed at the four end portions and the central part on the upper surface of the semiconductor element 22, i.e., at the five positions in total. Alternatively, as shown in FIG. 3, the thermosetting resin 25 may be disposed in the shape of a cross ranging from the central part to the end portions on the upper surface of the semiconductor element 22.

Figure 3:
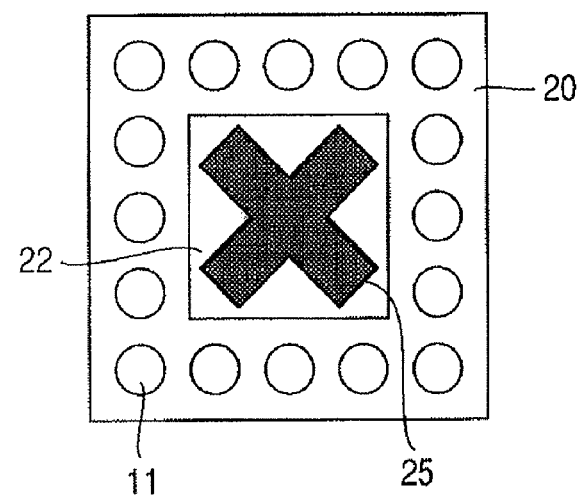
FIG. 3 is a plan view which shows an applied shape of a thermosetting resin in accordance with an example of the present invention.

That is, when the thermosetting resin is disposed in a dispersed manner such as shown in FIGS. 2 and 3, expansion and contraction is less suppressed than in the case where the thermosetting resin is applied to the whole area. Therefore, stress concentration become less likely to occur, and defects such as connection failure become likely to be caused. By adopting such shapes it becomes possible to control stresses in the wiring boards 10, 20 which are generated by the thermosetting resin 25. Particularly, when a high-rigidity thermosetting resin is used as described above, the effect of stresses is remarkable. Therefore, it is preferred that the shapes such as shown in FIGS. 2 and 3 be adopted.

Next, a production method of the stacking semiconductor device 1 will be described with reference to FIGS. 4A and 4B and FIGS. 5A and 5B.

Figure 4A:
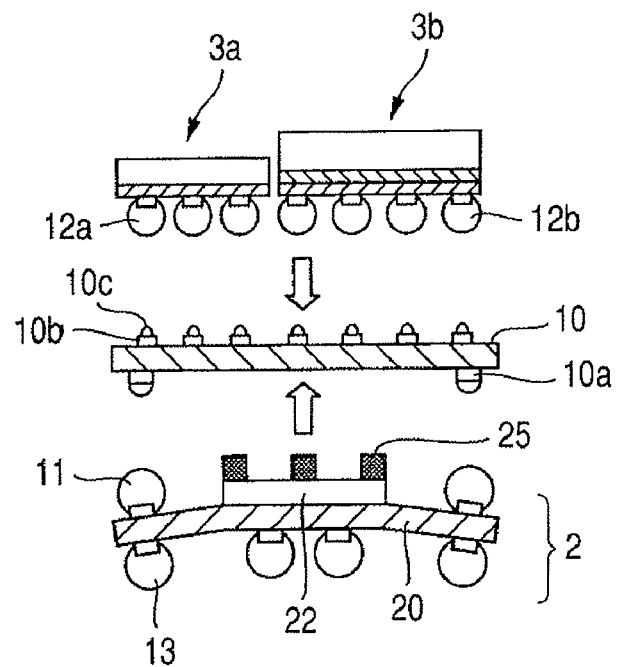
FIGS. 4A and 4B are cross-sectional views which show the production steps of a stacking semiconductor device in accordance with an example of the present invention.

First, as shown in FIG. 4A, a solder paste 10c is printed on the lands 10b of the wiring board 10, and the solder balls 12a, 12b of the second-layer semiconductor devices 3a, 3b are bonded thereto by a reflow process or the like. After that, the solder balls 11 on the front surface of the first-layer semiconductor device 2 and the lands 10a of the wiring board 10 are aligned to each other, followed by mounting. Then, heat is applied on the basis of a profile which requires preheating and main heating as a conventional reflow process for a solder, so that the solder balls 11 and the lands 10a are bonded to each other. The thermosetting resin 25 cures completely during the preheating, which is a thermal profile of the reflow process, whereby the first-layer semiconductor device 2 is bonded to the wiring board 10.

Specifically, the thermosetting resin 25 cures at 150° C. to 180° C., which are the preheating temperatures for a conventional reflow process, for 30 seconds to 90 seconds, thereby adhering the first-layer semiconductor device 2 to the wiring board 10. Here, the warpage behavior of the first-layer semiconductor device 2 during the reflow process and the role of the thermosetting resin 25 will be described.

Figure 4B:
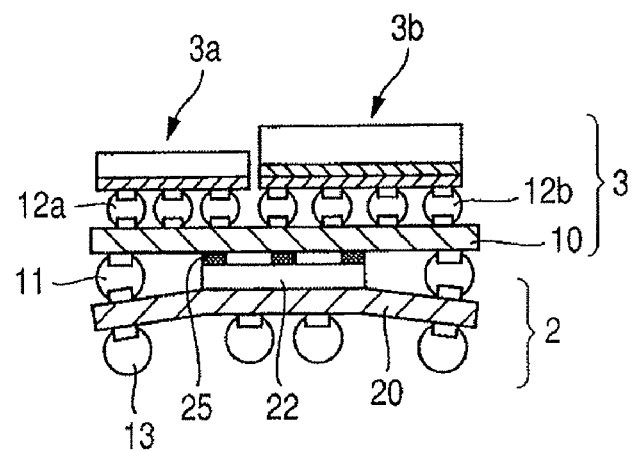
Figure 5A:
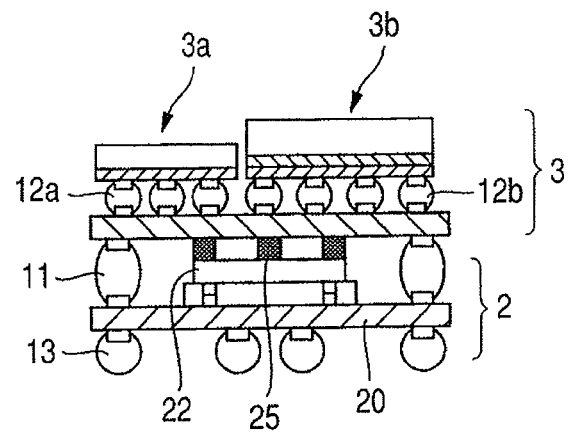
FIGS. 5A and 5B are cross-sectional views which show the production steps of a stacking semiconductor device in accordance with an example of the present invention.
Figure 10A:
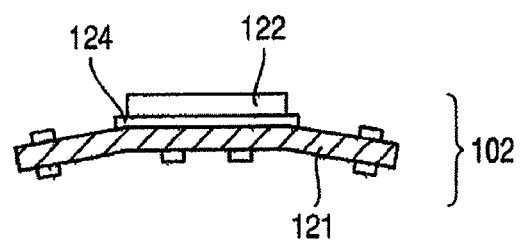
FIGS. 10A, 10B and 10C are cross-sectional views which explain the warpage of a semiconductor device.
Figure 10B:
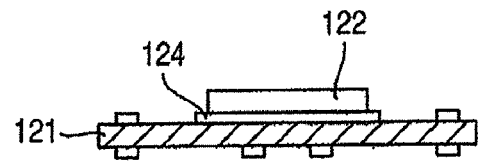
Figure 10C:
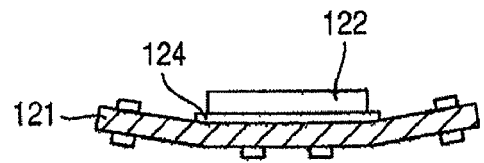
Figure 11A:
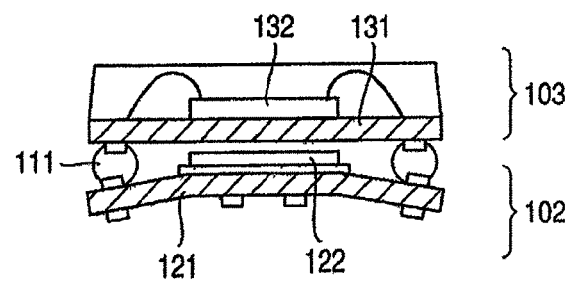
FIGS. 11A, 11B and 11C are cross-sectional views which explain the warpage of a stacking semiconductor device of a prior art example.
Figure 11B:
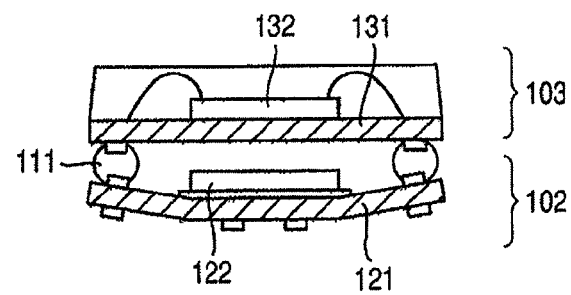
Figure 11C:
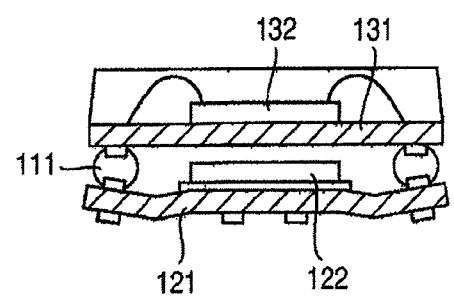

At the time of mounting, as shown in FIG. 4B, the wiring board 20 of the first-layer semiconductor device 2 warps in an upward convex manner as is the case with FIG. 10A. However, when heat is applied by the reflow process to raise the temperature up to 150-180° C., the wiring board 20 becomes almost flat as shown in FIG. 5A as is the case with FIG. 10B. In the present invention, attention is paid to the fact that the wiring board 20 once becomes flat at temperatures of from 150° C. to 180° C., and the wiring board 20 in the flat state is fixed to the wiring board 10, whereby the warpage of the wiring board 20 into a concave manner is suppressed.

After that, the external connection terminals 11 melt at 220° C. which is the solder melting temperature, and are bonded to the lands 10a of the wiring board 10 by means of the solder. Because the thermosetting resin 25 cures thermally, it does not soften even when the temperature rises up to 240° C., which is a peak temperature of a conventional lead-free reflow process. Therefore, the first-layer semiconductor 2 and the wiring board 10 are fixed to each other with their flat shapes being maintained.

Figure 5B:
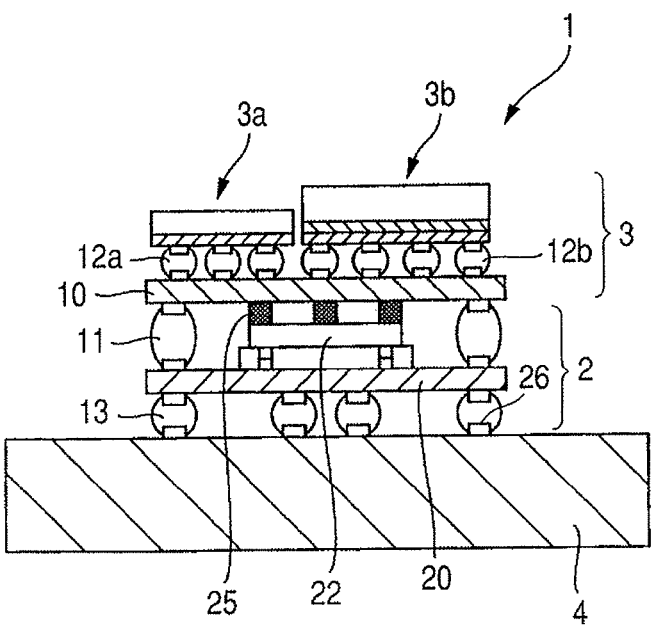

Furthermore, as shown in FIG. 5B, the stacking semiconductor device 1 is mounted on the mother board 4. Also in this step, the first-layer semiconductor device 2 fixed and adhered to the wiring board 10 by the thermosetting resin 25 is in a flat state and does not warp in a concave manner. Therefore, it is possible to prevent defects such as short circuiting between adjacent terminals, lowering of the bonding strength and lowering of the reliability resulting from an unusual solder shape, and the like.

(Simulation)

Next, a simulation was carried out in order to confirm the effects of the present invention. An analytical model for the simulation and the results of the analysis will be described below.

A modeling of the stacking semiconductor device 1 shown in FIG. 1 was performed. The physical property values of the materials of the analytical model are shown in Tables 1 to 6 below. Table 1 shows the physical property values of the thermosetting resin 25. Table 2 shows the physical property values of the solder balls 11, 12a, 12b, 13 and the wiring board 10. Table 3 shows the physical property values of the wiring board 20, the AFC resin 23 and the semiconductor element 22 which form the first-layer semiconductor device 2. Table 4 shows the physical property values of the wiring layer 31a and the semiconductor element 32a which form the semiconductor package 3a. Table 5 shows the physical property values of the wiring layer 31b, the semiconductor element 32b and the buffer material 33b which form the semiconductor package 3b. Table 6 shows the values which indicate the shapes of the solder balls 11, 12a, 12b, 13. Incidentally, the analytical model was carried out as a Full model. The solder was cubes in all of the semiconductor devices and carried out by a simple modeling.

The meshing of the wiring board 10, the mother board 4, the first-layer semiconductor device 2, and the second-layer semiconductor devices 3a, 3b was performed in their individual mesh sizes.

The physical property values of the wiring board 20, the mother board 4 and the wiring board 10 were obtained by averaging the physical property values of a core material, a built-up material and a solder resist and the physical property values shown in the tables were used. The physical property values at 23° C. were used because a linear analysis was performed.

The thermosetting resin 25 was provided on the semiconductor element 22 of the first-layer semiconductor device 2 as shown in FIG. 2. The thermosetting resin 25 was adhered to the semiconductor device 22 at the four corners and the center thereof with the size of each thermosetting resin 25 being 2.16×2.16×0.12 mm.

TABLE 1

| Material | | Thermosetting resin |
|---|---|---|
| Shape | mm | 2.16 × 2.16 × 0.12 |
| Young's modulus | MPa | $1.5 \times 10^4$ |
| Poisson's ratio | | 0.3 |
| Coefficient of linear expansion | 1/° C. | $5.5 \times 10^{-5}$ |

TABLE 2

| Material | | Solder | Wiring board |
|---|---|---|---|
| Shape | mm | See Table 6 | 12.5 × 12.5 × 0.2 |
| Young's modulus | MPa | $4.38 \times 10^4$ | $3.5 \times 10^4$ |
| Poisson's ratio | | 0.33 | 0.14 |
| Coefficient of linear expansion | 1/° C. | $2.13 \times 10^{-5}$ | $1.5 \times 10^{-5}$ |

TABLE 3

| Material | | Wiring board | ACF resin | Semiconductor element |
|---|---|---|---|---|
| Shape | mm | 12.5 × 12.5 × 0.45 | 7 × 7 × 0.03 | 7 × 7 × 0.15 |
| Young's modulus | MPa | $2.5 \times 10^4$ | $9 \times 10^3$ | $1.7 \times 10^5$ |
| Poisson's ratio | | 0.27 | 0.4 | 0.28 |
| Coefficient of linear expansion | 1/° C. | $1.5 \times 10^{-5}$ | $3.2 \times 10^{-5}$ | $3.5 \times 10^{-6}$ |

TABLE 4

| Material | | Wiring layer | Semiconductor element |
|---|---|---|---|
| Shape | mm | 4.51 × 5.7 × 0.07 | 4.51 × 5.7 × 0.5 |
| Young's modulus | MPa | $1.2 \times 10^4$ | $1.7 \times 10^5$ |
| Poisson's ratio | | 0.33 | 0.28 |
| Coefficient of linear expansion | 1/° C. | $1.2 \times 10^{-5}$ | $3.5 \times 10^{-6}$ |

TABLE 5

| Material | | Buffer material | Wiring layer | Semiconductor element |
|---|---|---|---|---|
| Shape | mm | 6.74 × 11 × 0.17 | 7.24 × 11.6 × 0.062 | 6.7 × 10.7 × 0.19 |
| Young's modulus | MPa | $7.5 \times 10^2$ | $9.0 \times 10^3$ | $1.7 \times 10^5$ |
| Poisson's ratio | | 0.35 | 0.2 | 0.28 |
| Coefficient of linear expansion | 1/° C. | $6.0 \times 10^{-5}$ | $1.6 \times 10^{-5}$ | $3.5 \times 10^{-6}$ |

TABLE 6

|  | Pitch | | Shape (mm) |
| --- | --- | --- | --- |
| First-layer semiconductor device | 0.65 | Wiring board side | 0.325 × 0.325 × 0.3 |
|  | 0.5 | Mother board side | 0.25 × 0.25 × 0.2 |
| Semiconductor device package (3a) | 0.5 | — | 0.25 × 0.25 × 0.1 |
| Semiconductor device package (3b) | 0.65 | — | 0.325 × 0.325 × 0.3 |

Figure 6:
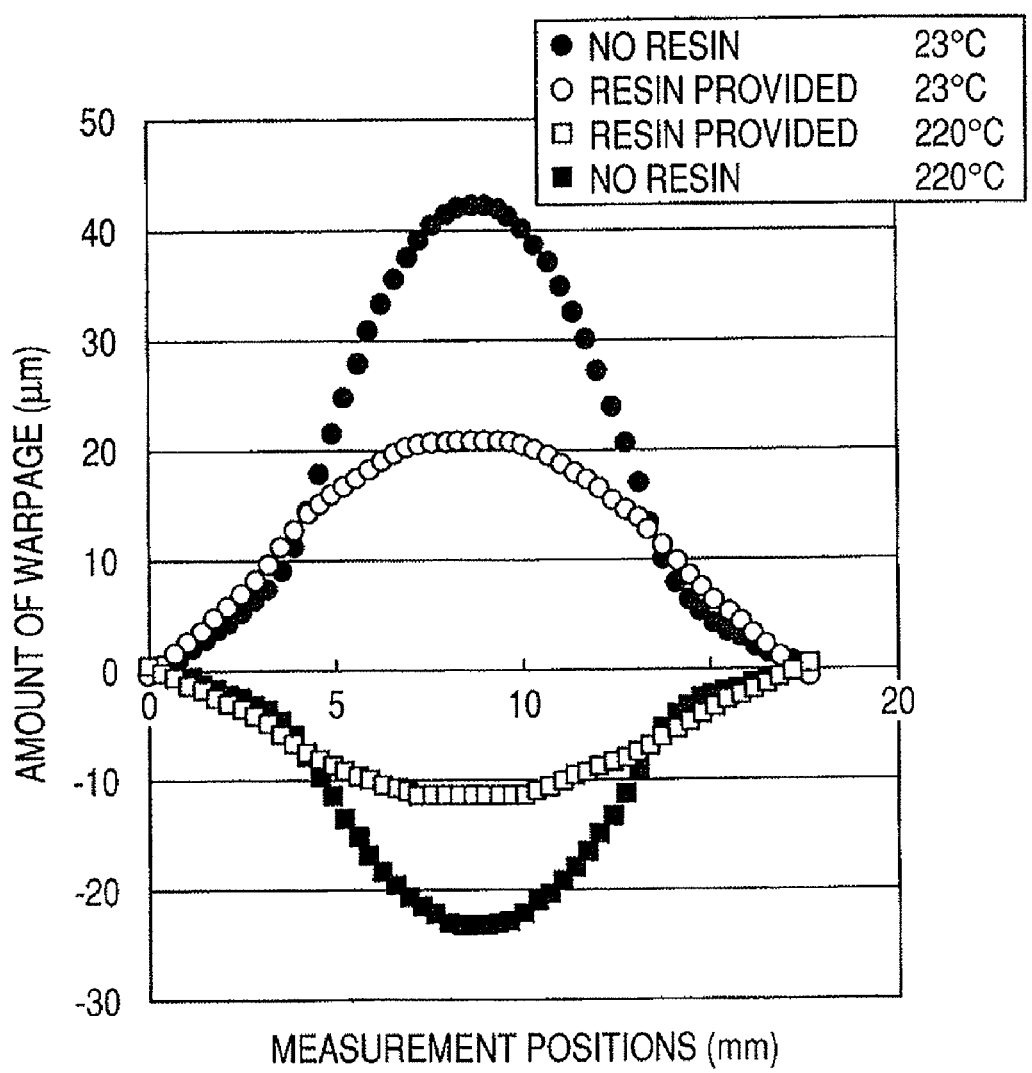
FIG. 6 is a graphical representation which shows the results of a simulation in accordance with an example of the present invention.
Figure 7:
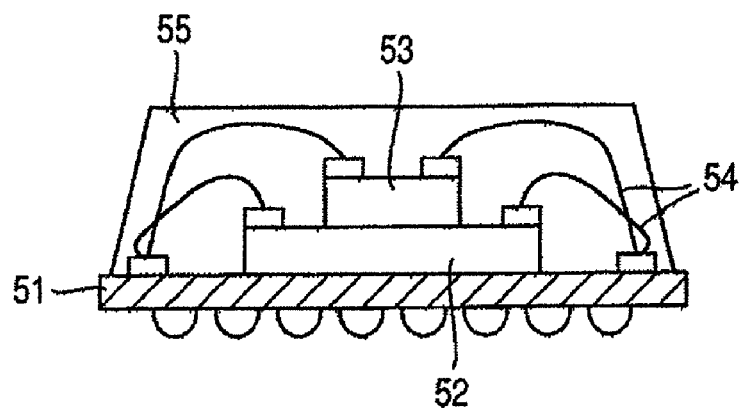
FIG. 7 is a cross-sectional view which shows a semiconductor device of a prior art example.
Figure 8:
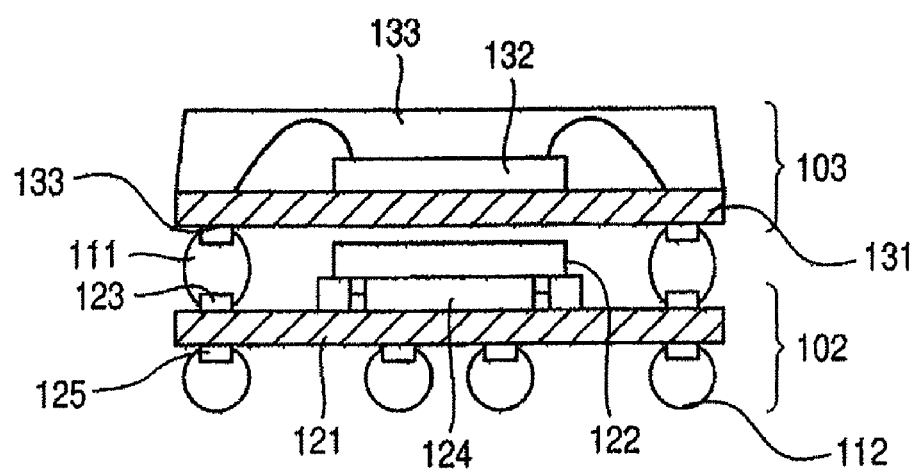
FIG. 8 is a cross-sectional view which shows a stacking semiconductor device of a prior art example.
Figure 9A:
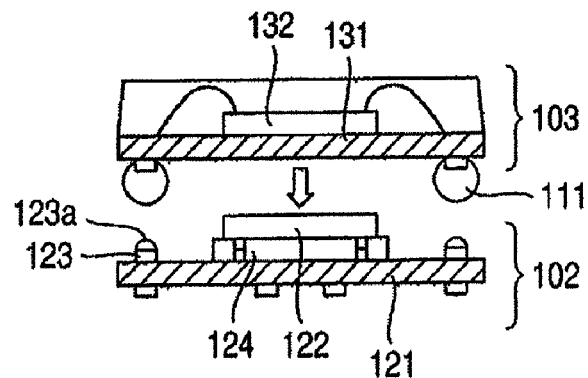
FIGS. 9A, 9B and 9C are cross-sectional views which show the production steps of a stacking semiconductor device of a prior art example.
Figure 9B:
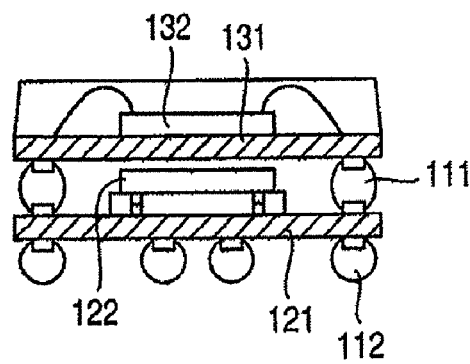
Figure 9C:
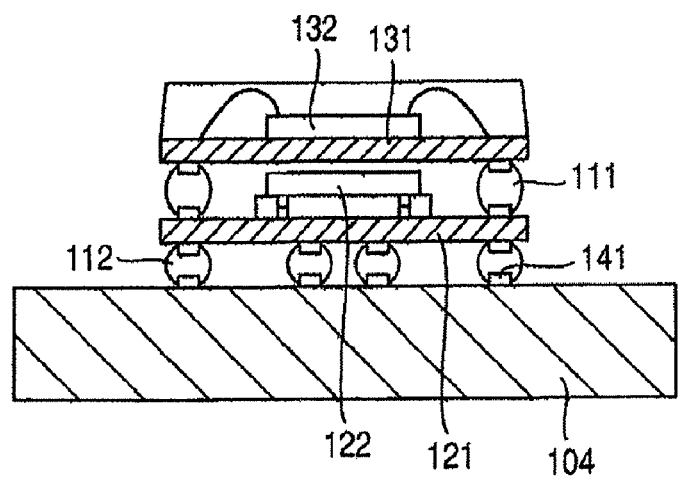

With the above-described analytical model, both the stacking semiconductor device 1 having the thermosetting resin 25 provided therein and a conventional-type stacking semiconductor device having no thermosetting resin 25 provided therein were analyzed. In the both stacking semiconductor devices, the amounts of warpage of the wiring board 20 at room temperature (23° C.) and at 220° C. at which the solder solidified were calculated. The results of the calculation are shown in FIG. 6. The term "stacking semiconductor device at room temperature" herein employed refers to the stacking semiconductor device shown in FIG. 5A which is not yet mounted on the mother board 4. The term "stacking semiconductor device at 220° C." herein employed refers to the stacking semiconductor device which is mounted on the mother board 4 as shown in FIG. 5B and in which the solder balls 13 are melted during the reflow process.

For the amount of warpage, the relative values of amounts of warpage at positions in the diagonal direction of the wiring board 20 are plotted with the value of amount of warpage at the center of the wiring board 20 being defined as zero. In FIG. 6 the abscissa indicates the distance from the center of the wiring board 20. For the wiring board 20 having the thermosetting resin 25, the values of amounts of warpage at 23° C., which is the temperature before the reflow process, are indicated by ○, and the values of amounts of warpage at 220° C., which is the temperature during the reflow process, are indicated by □. Similarly, in the case of the wiring board 20 having no thermosetting resin, the values of amounts of warpage at 23° C. are indicated by ●, and the values of amounts of warpage at 220° C. are indicated by ■.

As shown in FIG. 6, for the wiring board 20 having no thermosetting resin, the warpage at 23° C. is 42 μm in a convex manner and the warpage at 220° C. is 23 μm in a concave manner. In contrast, in the case of the wiring board 20 having the thermosetting resin 25 adhered thereto, the warpage at 23° C. is 21 μm in a convex manner and the warpage at 220° C. is 11 μm in a concave manner. That is, it can be seen that the amount of warpage of the wiring board is reduced by half by the provision of the thermosetting resin.

TABLE 7

| | Amount of Warpage | |
| --- | --- | --- |
|  | 23° C. | 220° C. |
| No resin | 42 μm | 23 μm |
| Resin provided | 21 μm | 11 μm |
|  | 50% decrease | 52% decrease |

Figure 12:
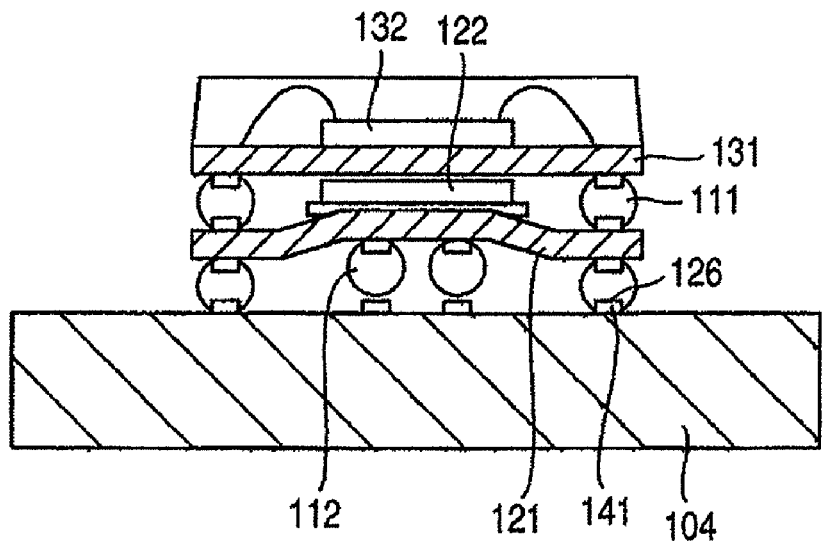
FIG. 12 is a cross-sectional view which explains a problem with a stacking semiconductor device of a prior art example.
Figure 13:
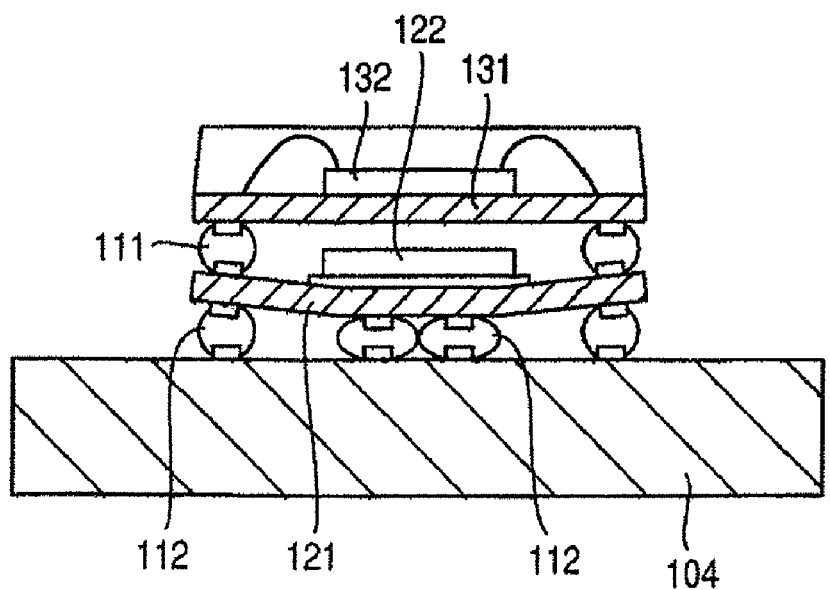
FIG. 13 is a cross-sectional view which explains a problem with a stacking semiconductor device of a prior art example.
Figure 14A:
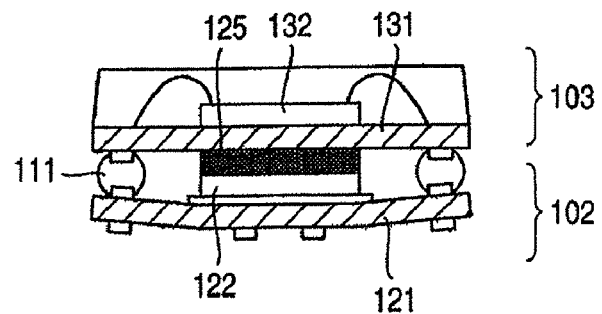
FIGS. 14A, 14B and 14C are cross-sectional views which explain the warpage of a stacking semiconductor device of a prior art example.
Figure 14B:
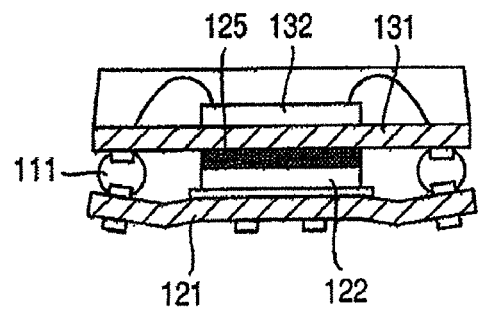
Figure 14C:
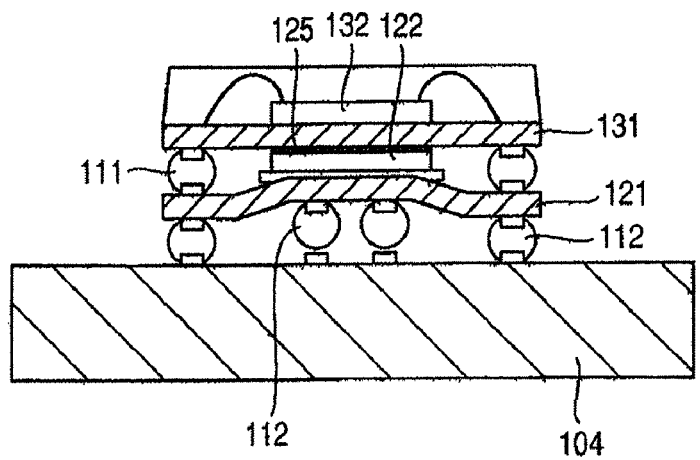

Here, a description will be made of the effect of warpage when the stacking semiconductor device 1 shown in FIG. 5A is mounted on the mother board 4 by use of the solder balls 13. As shown in FIG. 5B, on the lands formed on the surface of the mother board 4, there is applied a solder paste 26 beforehand in order to facilitate the bonding to the solder balls. The application of the solder paste 26 enables a variation in spacing between the stacking semiconductor device 1 and the mother board 4 to be absorbed. The height of the solder paste 26 transferred onto the mother board 4 by printing is about 90 μm on the average. However, the variation is large and there may be a case where the height is 50 μm or so. Therefore, when the amount of warpage of the wiring board 121 becomes 40 μm or more, at the time of mounting shown in FIG. 12, there is a possibility that the solder balls 112 formed around the center of the wiring board do not come into contact with the solder paste 126 provided on the lands 141 of the mother board 104, thereby causing a bonding failure.

Therefore, as is seen from Table 7, the use of the thermosetting resin 122 enables the amount of warpage of the wiring board 121 to be reduced to 40 μm or less, so that it is possible to improve the reliability of solder bonding.

Incidentally, in the present invention, the number of semiconductor elements mounted on a single wiring board and the number of layers of semiconductor devices stacked are not limited to those of the above described examples. Further, the type of mounting of semiconductor elements may be the flip chip mounting, the stacked package or the single package.

As described above, in the present invention, in order to reduce the warpage of at least two stacking semiconductor devices due to thermal stress, an adhesion fixing portion is provided which uses a thermosetting resin having a curing temperature less than a solder melting temperature. This enables the amount of warpage of the stacking semiconductor devices to be suppressed and connection failure or short circuiting of external connection terminals such as solder balls to be avoided, thereby remarkably improving the connection reliability.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Laid-Open No. 2005-250511, filed Aug. 31, 2005, and No. 2006-224310, filed Aug. 21, 2006, which are hereby incorporated by reference herein in their entirety.

The invention claimed is:

1. A method of producing a stacked semiconductor device having a first-layer semiconductor device and a second-layer semiconductor device formed by being staked on each other, comprising the steps of:
    disposing the second-layer semiconductor device on the first-layer semiconductor device which is warped
    providing, between a first-layer semiconductor device and a second-layer semiconductor device, solder and a thermosetting resin for bonding the first-layer semiconductor device and the second-layer semiconductor device;
    heating the first-layer semiconductor device and the second-layer semiconductor device to a first temperature at which the first-layer semiconductor device has a flat shape to cure the thermosetting resin;
    heating the first-layer semiconductor device and the second-layer semiconductor device to a second temperature which is higher than the first temperature to melt the solder; and
    cooling the first-layer semiconductor device and the second-layer semiconductor device to solidify the solder.

2. The method according to claim 1, wherein the curing temperature of the thermosetting resin is 150 to 180° C. and the heating time is 30 to 90 seconds.

\* \* \* \* \*